United States Patent [19]

Saito et al.

[11] Patent Number: 5,665,636
[45] Date of Patent: Sep. 9, 1997

[54] SUSCEPTER AND PROCESS FOR PRODUCTION THEREOF

[75] Inventors: Kazuo Saito; Takeshi Ishimatsu, both of Tokyo, Japan

[73] Assignee: Nisshinbo Industries, Inc., Tokyo, Japan

[21] Appl. No.: 374,233

[22] Filed: Jan. 18, 1995

[30] Foreign Application Priority Data

Feb. 3, 1994 [JP] Japan .................... 6-033127

[51] Int. Cl.$^6$ ........................................ C01B 31/00
[52] U.S. Cl. .................... 117/88; 423/445 R; 117/900
[58] Field of Search ................ 423/445 R, 447.2; 437/180, 82

[56] References Cited

U.S. PATENT DOCUMENTS 5,093,214 3/1992 Saito et al. .................... 423/447.2

Primary Examiner—Michael Lewis
Assistant Examiner—Stuart L. Hendrickson
Attorney, Agent, or Firm—Kubovcik & Kubovcik

[57] ABSTRACT

A suscepter, which is composed substantially of a vitreous carbon derived from polycarbodiimide resin; and a process for producing a suscepter, which includes molding a polycarbodiimide resin or a composition composed mainly of a polycarbodiimide resin, into a shape of a suscepter and then carbonizing the molded material in vacuum or an inert gas atmosphere.

The suscepter is free from the problems of the prior art, which has no pores on the surface and generates no impurity and which causes no cracking when used at high temperatures.

2 Claims, No Drawings

SUSCEPTER AND PROCESS FOR PRODUCTION THEREOF

BACKGROUND OF THE INVENTION (1) Field of the Invention

The present invention relates to a suscepter used in the gas-phase epitaxy of compound semiconductor (indium, gallium, arsenic and phosphorus are used), as well as to a process for production of said suscepter. More particularly, the present invention relates to a suscepter which has no pores on the surface and thereby generates no impurity and which causes no cracking when used at high temperatures, as well as to a process for production of said suscepter.

(2) Description of the Prior Art

Gas-phase epitaxy is also called "CVD" (Chemical Vapor Deposition) and is one of the thin-film formation techniques used in the production of semiconductor elements. In the gas-phase epitaxy, a gas-phase chemical reaction is conducted to form a thin film directly on a semiconductor substrate.

In the gas-phase epitaxy, a thin layer of a semiconductor material is formed epitaxially on a semiconductor substrate by thermal decomposition or a hydrogen reduction reaction of a gaseous component at a high temperature. In this case, the semiconductor substrate must be heated. In general, the semiconductor substrate is mounted on a heating substrate (a suscepter) and is heated via the suscepter.

When gas-phase epitaxy is conducted as above, the properties of the epitaxial layer obtained are controlled by the material constituting the suscepter used. Therefore, the material of the suscepter is a very important factor in gas-phase epitaxy.

As the material of the suscepter, there have been used silicon, molybdenum, tungsten, graphite, etc. Each of these materials is insufficient in stability at high temperatures and also has a problem in purity, and has not been satisfactory. That is, for example, graphite has pores on the surface and easily adsorbs gases, and emits harmful gases during epitaxial operation; and molybdenum and tungsten adversely affect, per se, the respective products obtained, even when they have high purities.

Currently, there is used, as the material of the suscepter, a graphite material comprising a graphite substrate and a silicon carbon (SiC) film formed thereon by CVD. However, since there is a difference in thermal expansion coefficient between the graphite substrate and the SiC film, the graphite material, when used at high temperatures (1,300°–1,700° C.), causes cracking, which invites staining of semiconductor with impurities.

OBJECT AND SUMMARY OF THE INVENTION

The object of the present invention is to provide a suscepter which is free from the problems of the prior art, which has no pores on the surface and generates no impurity and which causes no cracking when used at high temperatures.

The present inventors made a study based on an idea that a suscepter produced by carbonizing a polycarbodiimide resin (this resin gives a high carbon content and yet a high yield when fired) might be able to satisfy the above object. As a result, the present inventors completed the present invention.

The present invention provides:

a suscepter, which is composed substantially of a vitreous carbon derived from polycarbodiimide resin, and a process for producing a suscepter, which comprises molding a polycarbodiimide resin or a composition composed mainly of a polycarbodiimide resin, into a shape of a suscepter and then carbonizing the molded material in vacuum or an inert gas atmosphere.

DETAILED DESCRIPTION OF THE INVENTION

The present invention is hereinafter described in detail.

The suscepter mentioned in the present invention includes a heating substrate which is used for mounting the semiconductor substrate thereon, when the semiconductor substrate is heated so as to form a thin layer of a semiconductor material on the semiconductor substrate epitaxially, in the Gas-phase epitaxy process.

In the present invention, the suscepter is made substantially of a vitreous carbon derived from polycarbodiimide resin.

The polycarbodiimide resin can be produced by a per se known process or a process similar thereto [e.g., U.S. Pat. No. 2,941,956; Japanese Patent Publication No. 47-33279; J. Org. Chem., 28, 2069–2075 (1963); Chemical Review 1981, Vol. 81, No. 4, 619–621]. It can easily be produced, for example, by subjecting an organic diisocyanate to a condensation reaction (carbon dioxide is removed in the reaction) in the presence of a carbodiimidization catalyst.

The organic diisocyanate used in the above production of the polycarbodiimide resin may be any of an aliphatic type, an alicyclic type, an aromatic type, an aromatic-aliphatic type, etc. These may be used singly or in admixture of two or more (in the latter case, a copolycarbodiimide resin is obtained).

The polycarbodiimide resin used in the present invention includes a homopolymer or a copolymer each composed of at least one repeating unit represented by the following formula

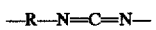

wherein R represents a residual group of organic diisocyanate.

The above R is preferably a residual group of aromatic diisocyanate, and herein, the residual group of organic diisocyanate refers to a portion of organic diisocyanate which is the organic diisocyanate molecule minus two isocyanate groups (two NCOs). Specific examples of such a polycarbodiimide resin are the following.

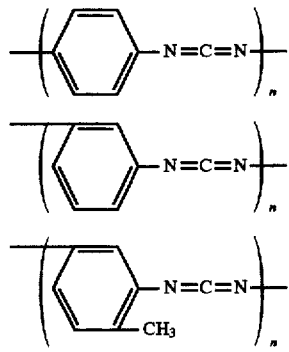

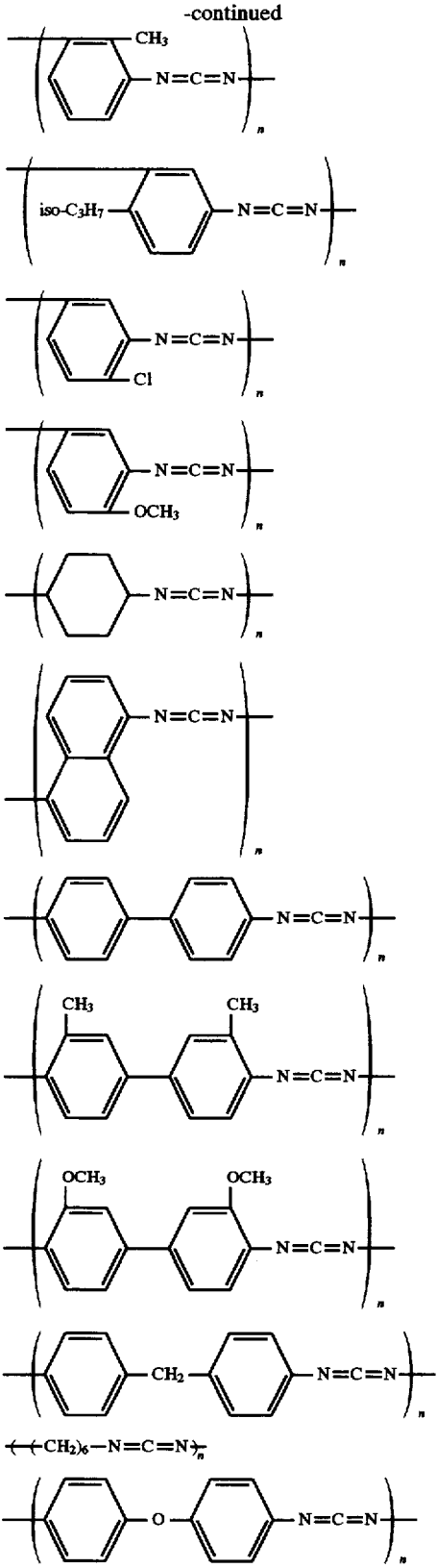

In each of the above formulas, n is 10–10,000, preferably 50–5,000; and the terminal(s) of each polycarbodiimide resin may be blocked with a monoisocyanate or the like.

The polycarbodiimide resin can be obtained in the form of a solution, or as a powder precipitated from the solution. The polycarbodiimide obtained in the form of a solution is used as it is or after removing the solvent; and the polycarbodiimide resin obtained as a powder is used as it is or after being dissolved in a solvent to convert it into a solution.

In the present invention, the polycarbodiimide resin powder or solution is first made into a molded material having a shape of a suscepter. The method of forming the molded material is not particularly restricted and can be a method generally used in production of such a suscepter, such as injection molding, compression molding, liquid injection molding, vacuum molding or the like.

Then, the molded material having a shape of a suscepter is heated to carbonize the polycarbodiimide resin, whereby an intended suscepter for semiconductor according to the present invention can be produced. The carbonization step can be conducted in vacuum or in an inert gas atmosphere such as nitrogen gas or the like. The final firing temperature is preferably 1,000°–3,000° C.

The thus obtained suscepter according to the present invention is made substantially of a vitreous carbon derived from the polycarbodiimide resin and has a bulk density of 1.51–1.8 g/cm$^3$, a bending strength of 1,800–4,000 kg/cm$^2$, a Shore hardness of 121–140, a porosity of 0–0.09% and an ash content of 0–4 ppm. Therefore, the suscepter of the present invention having substantially no pore, being minute and without crack, free from peeling off of carbon powder, is excellent.

The present invention is hereinafter described in more detail by way of Example.

EXAMPLE 54 g of a 2,4-tolylene diisocyanate/2,6-tolylene diisocyanate mixture (80:20) was reacted at 120° C. for 4 hours in 500 ml of tetrachloroethylene in the presence of 0.12 g of a carbodiimidization catalyst (1-phenyl-3-methylphospholene oxide) to obtain a polycarbodiimide resin solution.

The resin solution was casted into a mold corresponding to the shape of a suscepter to be obtained, and was molded at 60° C. for 20 hours and then at 120° C. for 10 hours. The resulting molded material was taken out of the mold. The material was heat-treated at 200° C. for 10 hours and then heated to 2,000° C. in vacuum to obtain a suscepter.

The suscepter was set in a small epitaxy apparatus (produced by Kokusai Denki) and subjected to the following durability test using a silane gas.

1. Setting of silicon wafer
2. Epitaxy (105° C., 1 hour)
3. Cooling and evaluation
4. Etching (HCl gas, 1,100° C., 1 hour)

The results are shown in Table 1.

TABLE 1

| Number of cycles | Condition |
|---|---|
| 50 | Normal |
| 100 | Normal |
| 150 | Normal |
| 200 | Normal |

Comparative Example

A suscepter was made from graphite (specific gravity 1.85 g/cm3, produced by Toyo Carbon). On this graphite suscepter was formed a SiC film by CVD. The resulting material was subjected to the same durability test as in Example. The results are shown in Table 2.

TABLE 2

| Number of cycles | Condition |
|---|---|
| 50 | Normal |
| 100 | Cracks appeared |
| 150 | Many cracks appeared |
| 200 | Many cracks appeared |

As shown in Tables 1 and 2, the suscepter of the present invention is made mainly of a carbonized polycarbodiimide resin and, unlike the suscepter of Comparative Example comprising graphite and a SiC film formed thereon, causes no cracking.

What is claimed is:

1. In a method of producing a semiconductor wherein a semiconductor substrate is mounted on a heating substrate, the semiconductor substrate is heated via the heating substrate and a thin layer of a semiconductor material is formed epitaxially on the heated semiconductor substrate by thermal decomposition or a hydrogen reduction reaction of a gaseous component at a high temperature, the improvement comprising using as a heating substrate a vitreous carbon formed by carbonizing a polycarbodiimide resin in vacuum or in an inert gas atmosphere, wherein the vitreous carbon has a bulk density of 1.51–1.8 g/cm$^3$, a bending strength of 1,800–4,000 kg/cm$^2$, a Shore hardness of 121–140, a porosity of 0–0.9% and an ash content of 0–4 ppm.

2. A method according to claim 1, wherein the carbonization of the polycarbodiimide resin is conducted in a temperature range of 1,000°–3,000° C.

* * * * *